United States Patent
Dai et al.

(10) Patent No.: US 8,103,021 B2
(45) Date of Patent: Jan. 24, 2012

(54) AUDIO REPRODUCING APPARATUS

(75) Inventors: Lung Dai, Taipei Hsien (TW); Wang-Chang Duan, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 403 days.

(21) Appl. No.: 12/463,422

(22) Filed: May 11, 2009

(65) Prior Publication Data

US 2009/0285411 A1 Nov. 19, 2009

(30) Foreign Application Priority Data

May 19, 2008 (CN) .......................... 2008 1 0301627

(51) Int. Cl.
| | |
|---|---|
| *H01B 15/00* | (2006.01) |
| *G06F 17/00* | (2006.01) |
| *H01H 7/00* | (2006.01) |
| *H01H 9/00* | (2006.01) |
| *H01H 47/00* | (2006.01) |
| *H01H 47/18* | (2006.01) |
| *H01H 51/30* | (2006.01) |
| *H01H 47/32* | (2006.01) |
| *H03K 17/28* | (2006.01) |

(52) U.S. Cl. ...... 381/94.5; 381/94.1; 381/120; 381/123; 381/55; 700/94; 307/141; 327/392; 327/298; 361/195; 361/196; 361/197; 361/198; 361/199; 361/200

(58) Field of Classification Search ................ 381/94.5, 381/94.1, 120, 123, 55; 455/194.1, 194.2; 348/632, E5.098; 330/51; 700/94; 307/141; 327/392, 398; 361/195–200
See application file for complete search history.

(56) References Cited

U.S. PATENT DOCUMENTS
2008/0310651 A1   12/2008   Tai

FOREIGN PATENT DOCUMENTS
CN          200953603 Y        9/2007

*Primary Examiner* — Phat X Cao
*Assistant Examiner* — Diana C Vieira
(74) *Attorney, Agent, or Firm* — Altis Law Group, Inc.

(57) ABSTRACT

An audio reproducing apparatus includes a power supply, an amplifier, a speaker, and a controller. The power supply is for supplying a voltage. The amplifier is for receiving the voltage and audio signals, amplifying the audio signals, and outputting amplified audio signals. The speaker is for reproducing sound after receiving the amplified audio signals. The controller is for receiving the voltage and generating a control signal to enable the amplifier. The controller includes a generator and a delay unit. The generator is for receiving the voltage and generating the control signal. The delay unit is for delaying the time of transferring the voltage from the power supply to the generator.

6 Claims, 2 Drawing Sheets

AUDIO REPRODUCING APPARATUS

BACKGROUND

1. Technical Field

The present disclosure relates to electronic devices, particularly relates to an audio reproducing apparatus.

2. Description of Related Art

Audio reproducers, such as speakers, earphones, are widely used in electronic devices. By using these audio reproducers, users can enjoy music and listen to broadcasted information. With the development of the electronic technology, the audio reproducers have achieved more audio effects, such as stereophonic sound. However, users often hear pop/cracking noise when turning on or off their audio reproducing apparatus.

Therefore, audio reproducing apparatus is needed in the industry to address the aforementioned deficiency.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Figure 1:
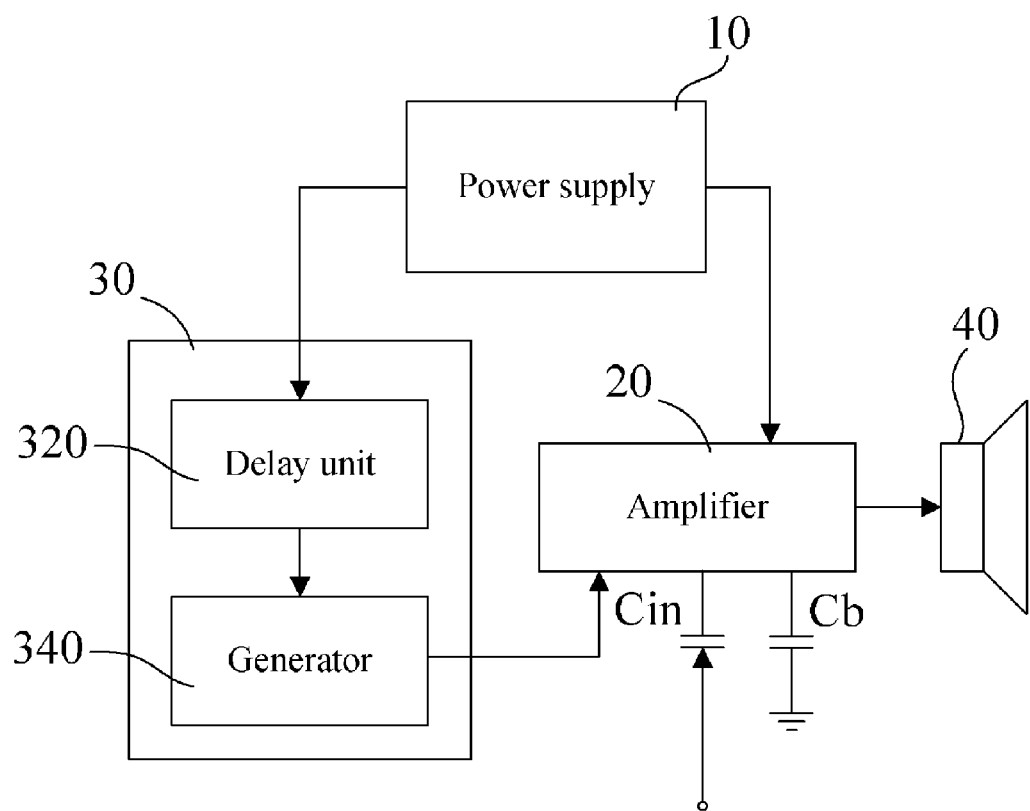
FIG. 1 is a schematic diagram showing an audio reproducing apparatus including a controller in accordance with an exemplary embodiment.

Referring to FIG. 1, an audio reproducing apparatus 100 in accordance with an exemplary embodiment is illustrated. The audio reproducing apparatus 100 includes a power supply 10, an amplifier 20, a controller 30, and a speaker 40. The power supply 10 supplies a voltage V to the amplifier 20 and the controller 30. The amplifier 20 receives audio signals via an input capacitor Cin, amplifies the audio signals, and outputs amplified audio signals. The controller 30 generates a control signal, and uses the control signal to control the amplifier 20. In this embodiment, when the control signal is high, the amplifier 20 may be enabled. The speaker 40 reproduces sound after receiving the amplified audio signals. The amplifier 20 is also connected to a bypass capacitor Cb. There are three requirements that must be achieved to enable the amplifier 20. The three requirements of the amplifier 20 are: receiving the voltage V, receiving the control signal, and charging the bypass capacitor Cb to a threshold voltage of 0.5*V.

The controller 30 includes a delay unit 320 and a generator 340. The delay unit 320 delays the time of transferring the voltage V from the power supply 10 to the generator 340. The generator 340 receives the voltage V and generates the control signal.

Figure 2:
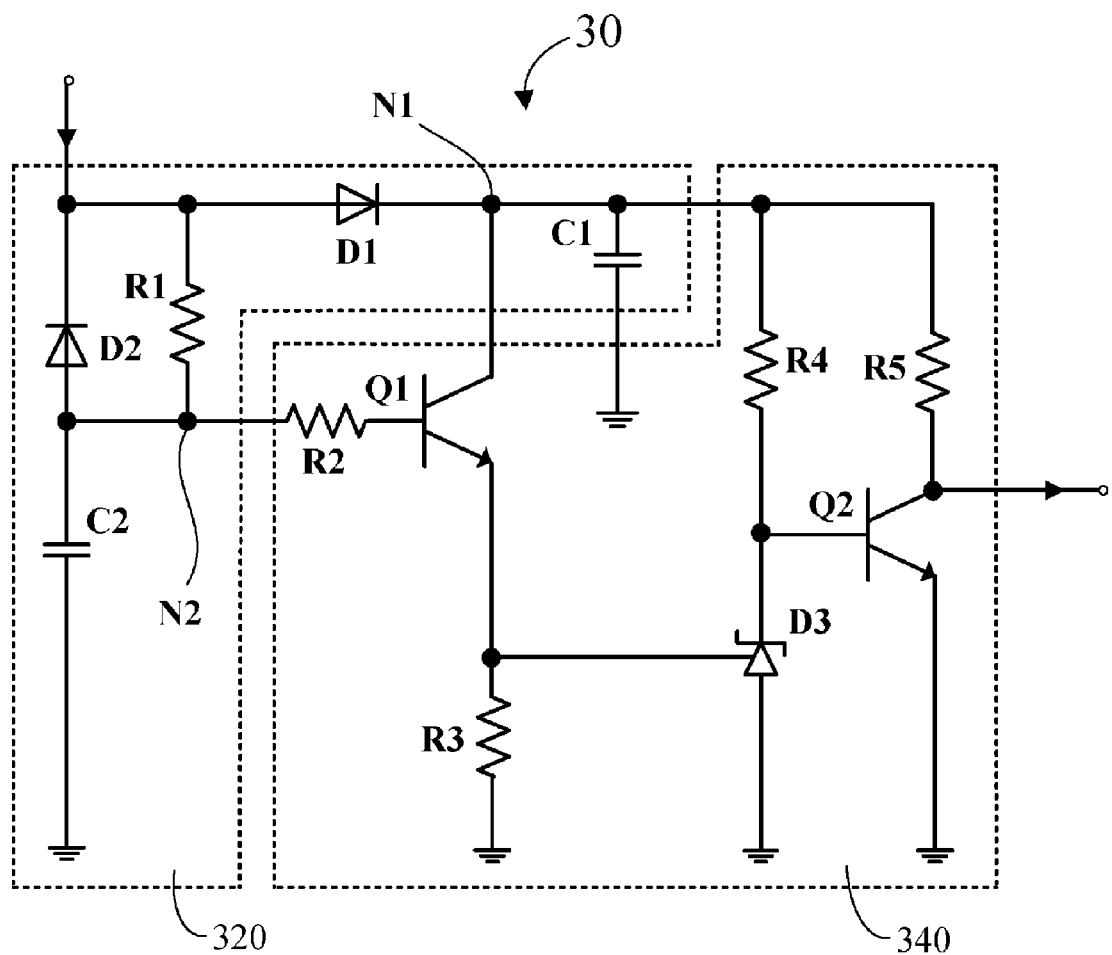
FIG. 2 is a circuit diagram showing detailed structure of the controller.

Referring to FIG. 2, the delay unit 320 includes a first diode D1, a first capacitor C1, a first resistor R1, a second diode D2, and a second capacitor C2. The second diode D2 is reversed biased between the power supply 10 and a second node N2. The second capacitor C2 is connected between the anode of the first diode D1 and ground. The first resistor R1 is connected in parallel to the second diode D2. The first diode D1 is forward biased between the power supply 10 and a first node N1. The first capacitor C1 is connected between the cathode of the first diode D1 and ground.

The generator 340 includes a first bipolar junction transistor (BJT) Q1, a second BJT Q2, a shunt regulator D3, a second resistor R2, a third resistor R3, a fourth resistor R4, and a fifth resistor R5. In this embodiment, the first BJT Q1 and the second BJT Q2 are NPN type. The base of the first BJT Q1 is connected to the second node N2 via the second resistor R2, the emitter is connected to ground via the third resistor R3, and the collector is connected to the first node N1. The base of the second BJT Q2 is connected to the first node N1 via the fourth resistor R4, the collector is connected to the first node N1 via the fifth resistor R5, and the emitter is grounded. The reference of the shunt regulator D3 is connected to the emitter of the first BJT Q1, the anode is grounded, and the cathode is connected to the base of the second BJT Q2. The reference voltage for the shunt regulator D3 is set at a certain value (or above) to turn on the shunt regulator D3.

In a powering-on operation, the power supply 10 supplies the voltage V to the amplifier 20 and the controller 30, and the bypass capacitor Cb is fully charged to 0.5*V immediately. However, the amplifier 20 is not enabled until receiving the control signal. The voltage V charges the first capacitor C1 via the first diode D1, and charges the second capacitor C2 via the first resistor R1. When the second capacitor C2 is charged to a first threshold voltage of the first BJT Q1, the first BJT Q1 turns on and the shunt regulator D3 conducts. The second BJT Q2 is off due to a low voltage at its base. Thus, the collector of the second BJT Q2 generates the control signal. Therefore, the time of generating the control signal is delayed. The input capacitor Cin will be fully charged before the amplifier 20 is enabled because of the delay of receiving the control signal.

In a powering-off operation, the power supply 10 stops supplying the voltage V, and the bypass capacitor Cb is discharged. At the same time, the second capacitor C2 of the controller 30 discharges via the second diode D2. When the voltage of the node N2 is lower than first threshold voltage of the first BJT Q1, the first BJT Q1 turns off and the shunt regulator D3 stops conducting. The second BJT Q2 turns on, pulling the collector to ground, and thus the control signal goes low. Thus, the amplifier 20 is disabled, and then the input capacitor Cin is discharged.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An audio reproducing apparatus comprising:
   a power supply for supplying a voltage;
   an amplifier for receiving the voltage and audio signals, amplifying the audio signals, and outputting amplified audio signals;
   a speaker for reproducing sound after receiving the amplified audio signals; and
   a controller for receiving the voltage and generating a control signal to enable the amplifier, the controller comprising:
      a generator for receiving the voltage and generating the control signal; and
      a delay unit for delaying the time of transferring the voltage from the power supply to the generator, the delay unit comprising a first capacitor connected between ground and an interconnection of the power supply and the generator;

wherein the delay unit further comprises a first diode, a second diode, a second capacitor, and a first resistor; the first diode is forward biased between the power supply and the generator; the second diode is reversed biased between the power supply and the generator; the second capacitor is connected between the anode of the second diode and ground, and the first resistor is connected in parallel to the second diode; and the generator comprises a first bipolar junction transistor, with its base connected to the second capacitor via a second resistor, its collector connected to the cathode of the first diode, its emitter connected to ground via a third resistor.

2. The audio reproducing apparatus according to claim 1, wherein the generator comprises a shunt regulator, with its reference connected to the emitter of the first bipolar junction transistor, its anode grounded, and its cathode connected to the cathode of the first diode via a fourth resistor.

3. The audio reproducing apparatus according to claim 2, wherein the generator comprises a second bipolar junction transistor, with its base connected to the cathode of the shunt regulator, its emitter grounded, and its collector connected to the cathode of the first diode via a fifth resistor.

4. An audio reproducing apparatus comprising:

a power supply for supplying a voltage;

an amplifier for receiving the voltage and audio signals, amplifying the audio signals, and outputting amplified audio signals;

a speaker for reproducing sound after receiving the amplified audio signals;

a first capacitor connected between ground and an interconnection of the power supply and the amplifier;

a first diode forward biased between the power supply and the first capacitor;

a first resistor;

a second diode; and a second capacitor;

wherein the second diode is reversed biased between the power supply and the second capacitor, and the second capacitor is connected between the anode of the second diode and ground, and the first resistor is connected in parallel to the second diode; and a first bipolar junction transistor, with its base connected to the second capacitor via a second resistor, its collector connected to the cathode of the first diode, its emitter connected to ground via a third resistor.

5. The audio reproducing apparatus according to claim 4, further comprising a shunt regulator, with its reference connected to the emitter of the first bipolar junction transistor, its anode grounded, and its cathode connected to the cathode of the first diode via a fourth resistor.

6. The audio reproducing apparatus according to claim 5, further comprising a second bipolar junction transistor, with its base connected to the cathode of the shunt regulator, its emitter grounded, and its collector connected to the cathode of the first diode via a fifth resistor.

* * * * *